United States Patent [19]

Yahalom

[11] 3,844,904

[45] Oct. 29, 1974

[54] ANODIC OXIDATION OF GALLIUM PHOSPHIDE

[75] Inventor: Joseph Yahalom, Haifa, Israel

[73] Assignee: Bell Telephone Laboratories Incorporated, Murray Hill, N.J.

[22] Filed: Feb. 7, 1974

[21] Appl. No.: 440,395

Related U.S. Application Data

[63] Continuation of Ser. No. 342,462, March 19, 1973.

[52] U.S. Cl. .............................................. 204/56 R
[51] Int. Cl. .............................................. C23b 11/02
[58] Field of Search .................................. 204/56 R

[56] References Cited

UNITED STATES PATENTS 3,264,201 8/1966 Schink et al. .................... 204/56 R

*Primary Examiner*—R. L. Andrews
*Attorney, Agent, or Firm*—W. G. Nilsen

[57] ABSTRACT

A process is described for producing passivating and insulating layers on GaP and related compounds. The process involves anodic oxidation under conditions which permit the use of high current densities without detrimental effects on layer properties.

8 Claims, No Drawings

ANODIC OXIDATION OF GALLIUM PHOSPHIDE

CROSS REFERENCE TO RELATED APPLICATIONS

This application is a continuation of a copending application, Ser. No. 342,462, filed March 19, 1973.

BACKGROUND OF THE INVENTION

1. Field of the Invention

The invention involves making surface insulating layers on GaP and related compounds by means of anodic oxidation.

2. Description of the Prior Art

In semiconductor technology, surface layers are often used in fabrication techniques. Surface layers are used to passivate portions or all of a semiconductor surface, for pattern delineation and for electrical insulating layers.

A particularly convenient type layer to use for such applications is the oxide of the semiconductor produced by oxidation of the semiconductor surface. Such native oxide layers are conveniently made, usually have good adherence properties and do not usually involve the introduction of impurities detrimental to the properties of the semiconductor. Recently, it has been shown that passivation by native oxides of GaP significantly reduces degradation of red electroluminescent diodes at elevated temperatures [Hartman, Schwartz and Kuhn, Applied Physics Letters 18, 304 (1971)].

Methods of making the oxide layer are particularly important not only for economic considerations where large numbers of devices are being made, but also because the physical properties of the layer are particularly important in many applications. For example, where the oxide layer is used for pattern delineation, photolithographic techniques are often used. Such techniques usually involve etching of the oxide layer. Film uniformity as evidenced by uniform etch rate is highly desirable since it minimizes undercutting and makes possible patterns of high resolution. Also, compact films, that is, films of low porosity, are desirable when the oxide layer is used as a passivating layer since such films prevent diffusion and more effectively prevent doping under the passivating layer.

Chemical oxidation procedures are usually used to produce an oxide layer on gallium phosphide and related compounds. A typical procedure involves exposure of the gallium phosphide surface to an oxidizing agent such as aqueous hydrogen peroxide [see, for example, B. Schwartz, Journal of Electrochemical Society 118, 657 (1971)]. Films produced in accordance with this reference require considerable time to produce.

The oxide layers grown in accordance with many of these chemical techniques are found to be porous and not sufficiently uniform for some applications. Exposure of the layer to a baking operation decreases porosity, but this procedure increases processing time and does not always decrease porosity sufficiently for some applications. Further, the baking operation often alters the properties of other parts of the semiconductor in an undesirable way.

SUMMARY OF THE INVENTION

The invention is a process for fabricating gallium phosphide devices in which oxide layers are grown on the gallium phosphide by an anodic oxidation technique. Special conditions are specified which allow rapid production of uniform and compact oxide layers using high current densities. Current densities of at least one mA/cm$^2$ should be used. Particularly important is the use of a buffer concentration in the electrolyte far in excess of that previously associated with anodic oxidation. In addition, the pH of the aqueous electrolyte solution is maintained between 4 and 7. Using this technique oxide layers with thicknesses of 1,000 Angs. can be produced in times as short as 2 seconds. Oxide layers produced in accordance with this invention are consistently uniform, as evidenced by excellent electrical and optical properties and by essentially constant etch rates, and are highly compact so as to prevent diffusion of dopants through the layer during fabrication processes. The process is also applicable to compounds closely related to gallium phosphide as further enumerated in the detailed description section. The anodic oxidation is carried out at a temperature between the freezing point and the boiling point of the electrolyte. Room temperature is preferable for convenience but in some applications where rapid reaction of the buffer with the hydrogen ions liberated during anodic oxidation is required, a temperature between 80° C and the boiling point of the electrolyte may be preferred. Generally, high current densities are used to minimize the time required to produce the anodic oxide layer.

DETAILED DESCRIPTION

In order to produce highly uniform and compact oxide films with desirable electrical and optical properties, the conditions for anodic oxidation must be carefully controlled. Three things are of primary importance regarding processing conditions. First, the pH of the electrolyte should be maintained between 4 and 7. Second, the time that the oxide film is exposed to the electrolyte should be minimized by using high rates of anodic oxidation. This requires maximizing the current used in the anodic oxidation. Third, it has been found that the maximum current that can be used to produce uniform and compact oxide films is increased by using a buffer at high concentration.

The pH of the electrolyte may be adjusted to within the range of 4–7 in a variety of ways. For example, the selection of buffer and buffer concentration may be used to satisfy the pH requirement. Otherwise, a pH adjusting substance such as acid or base may be used to bring the pH to within the required range. It is postulated that with anodic oxidation, a high dissolution rate is undesirable because dissolution is not uniform and leads to non-uniform and porous films. Thus, below pH 4, the oxide film is found to be non-uniform and porous presumably due to dissolution during formation of the oxide film. Above pH 7, the oxide film dissolves after formation.

Minimum contact time with the electrolytic solution has also been found to yield more uniform and compact films. In order to obtain films of sufficient thickness for various applications, this requires high current densities. Current density should be greater than one mA/cm$^2$, preferably 5 or 10 mA/cm$^2$ or higher so as to minimize contact time with the electrolyte.

It is essential to the invention that more than an order of magnitude more buffer be used than predicted by ordinary equilibrium considerations in order to produce oxide films that are uniform and compact. The use of highly buffered electrolyte with pH in the range of 4–7 yields oxide films which are highly uniform and compact. Any buffering system may be used that has reasonable buffering properties in the pH range of 4–7 and is compatible with the anodic oxidation process. (For example, buffering systems (i.e., citrate) which form complexes with Ga and/or P should be avoided since such complex formation prevents anodic oxidation.) Typical buffering systems that can be used are hydrogen phthalate ion system and the dihydrogen phosphate-hydrogen phosphate ion system. These buffering ions may be introduced in a variety of ways well known in the art including adding the alkali-metal salt of the buffering ions such as the potassium salt. Either acid or base may be added to adjust the pH to a value within the range from 4–7.

Concentration of buffer is an important variable in this process. Indeed, the invention involves the realization that oxide films which are uniform and compact can be produced at higher currents if high buffer concentrations are used in the electrolyte. This permits less contact time with the electrolyte which improves the uniformity and compactness of the oxide layer. It also reduces process time which is economically advantageous. However, too high a buffer concentration leads to electrical breakdown of the oxide film. For this reason, buffer concentration is limited to about 1M. Below 0.01M buffer concentration, current densities that may be used without yielding non-uniform oxide films are undesirably low so that excessive contact time with the electrolyte is required. A buffer concentration range of 0.03 to .3 is preferred as giving a reasonable compromise between usable current density and electrical breakdown of the oxide film.

In other respects, the aqueous electrolyte is conventional. Various ions are used to support electrical conduction in the electrolyte. These ions may be the same as the buffering substance or may be different. Acids such as sulfuric acid and bases such as sodium hydroxide are added to adjust pH to the prescribed range and to provide conducting ions. Ionic salts may also be added to increase electrolyte conductivity.

Current densities usable in this process may become sufficiently high so that only a short duration pulse is needed to produce oxide layers satisfactorily for semiconductor processing. A pulse as short as two seconds yields an oxide coating of approximately 1,000 Angs. thickness which is highly uniform and compact.

The process described above may be used to grow oxide layers on various semiconductors which are closely related to GaP. The process is applicable to a variety of III–V semiconductors. In particular, the process is useful in producing oxide layers on the closely related compound GaAs and mixed compounds $GaP_{1-x}As_x$ where x ranges from 0 to 1.

Several examples are given to illustrate the invention. The gallium phosphide slices used in these examples are cut from *n*-type Se-doped Czochralski-grown crystals. The face on which the oxide coating is grown is first etched and polished in bromine-methanol. Anodization is carried out in a Teflon cell with platinum counterelectrodes.

EXAMPLE 1

A semiconductor slice prepared as above, is immersed in an electrolyte consisting of 0.1M potassium dihydrogen phosphate and sufficient sodium hydroxide to adjust the pH of the electrolyte to 6. The anodization is carried out at a current density of 10 milliamps per cubic square and results in an oxide film thickness of 600 Angs.

EXAMPLE 2

Same as example 1 except a current density of 100 milliamps per cubic square is used. This results in a film thickness of 850 Angs.

EXAMPLE 3

Same as example 1 except sufficient sodium hydroxide is added to adjust the pH to 8. This results in a film thickness of 600 Angs.

EXAMPLE 4

Same as example 3 except a current density of 100 milliamps per cubic square is used. This results in a film thickness of 900 Angs.

What is claimed is:

1. A process for the anodic oxidation of III–V semiconductor compounds carried out in an electrolyte with an anodizing current characterized in that the anodizing current is greater than one $mA/cm^2$ the electrolyte is buffered with a buffer concentration of between 0.01M and 1.0M and the pH is between 4 and 7.

2. Process of claim 1 in which the buffer concentration is 0.03M to .3M.

3. Process of claim 1 in which the semiconductor compound is $GaP_{1-x}As_x$ with x ranging from 0 to 1.

4. Process of claim 3 where the semiconductor compound is GaP.

5. Process of claim 1 in which the anodizing current is greater than 5 $mA/cm^2$.

6. Process of claim 1 in which hydrogen phthalate ions are used as the buffer.

7. Process of claim 6 in which potassium hydrogen phthalate is used as the buffer.

8. Process of claim 1 in which buffering is provided by dihydrogen phosphate-hydrogen phosphate ion buffering system.

* * * * *